United States Patent [19]

Shuskus et al.

[11] Patent Number: 4,537,651
[45] Date of Patent: Aug. 27, 1985

[54] METHOD FOR REMOVING SEMICONDUCTOR LAYERS FROM SALT SUBSTRATES

[75] Inventors: Alexander J. Shuskus, West Hartford, Conn.; Melvyn E. Cowher, East Brookfield, Mass.

[73] Assignee: United Technologies Corporation, Hartford, Conn.

[21] Appl. No.: 441,325

[22] Filed: Nov. 12, 1982

Related U.S. Application Data

[63] Continuation of Ser. No. 266,544, May 22, 1981, abandoned.

[51] Int. Cl.³ ............................................. C30B 25/12
[52] U.S. Cl. ................................... 156/613; 427/86
[58] Field of Search ...................... 156/610, 613, 614; 427/86, 255.2; 148/175

[56] References Cited

U.S. PATENT DOCUMENTS

| | | | |
|---|---|---|---|
| 3,158,511 | 11/1964 | Robillard | 156/612 |
| 3,186,880 | 6/1965 | Skaggs et al. | 156/610 |
| 3,993,533 | 11/1976 | Milnes et al. | 156/613 |
| 4,116,751 | 9/1978 | Zaromb | 156/600 |
| 4,255,208 | 3/1981 | Deutscher et al. | 148/175 |

Primary Examiner—Hiram H. Bernstein
Attorney, Agent, or Firm—Charles E. Sohl

[57] ABSTRACT

A method is described for removing a CVD semiconductor layer from an alkali halide salt substrate following the deposition of the semiconductor layer. The semiconductor-substrate combination is supported on a material such as tungsten which is readily wet by the molten alkali halide. The temperature of the semiconductor-substrate combination is raised to a temperature greater than the melting temperature of the substrate but less than the temperature of the semiconductor and the substrate is melted and removed from the semiconductor by capillary action of the wettable support.

7 Claims, 4 Drawing Figures

METHOD FOR REMOVING SEMICONDUCTOR LAYERS FROM SALT SUBSTRATES

The Government has rights in this invention pursuant to subcontract XS-0-9002-5 awarded by the Solar Energy Research Institute in connection with a Department of Energy contract.

This is a continuation of application Ser. No. 266,544 filed on May 22, 1981 now abandoned.

TECHNICAL FIELD

This invention relates to the production of thin film semiconductors.

BACKGROUND ART

In the past many attempts have been made to produce thin films of semiconductor materials by epitaxially depositing a layer of semiconductor material on a substrate and subsequently removing the film. Deposition techniques include physical vapor deposition (PVD) by evaporation of an elemental semiconductor material such as germanium, and chemical vapor deposition (CVD) by the decomposition of a precursor such as germane. Much of the demand for semiconductor thin films is for high quality single crystal films and the production of thin single crystal film requires single crystal substrates. Sodium chloride has been described in the prior art as being suited for the production of thin semiconductor films. Sodium chloride has a similar crystal structure and lattice parameter to several semiconductor materials including germanium, silicon and gallium arsenide.

It has been proposed to produce thin films of semiconductors on sodium chloride using both the previously mentioned PVD and CVD techniques. However, attempts to accomplish this have not been entirely successful due to the interaction of the sodium chloride substrate with the applied semiconductor layer. Both the PVD and CVD processes require that the substrate be heated to encourage the formation of an adherent single crystal (epitaxial) coating. At the temperature required the sodium chloride substrate sublimes and the sublimed material contaminates the semiconductor film and suppresses epitaxial growth. Recently, a plasma assisted deposition technique has been developed and is a particularly preferred process. This process permits the substrate to be maintained at a relatively low temperature while the precursor gas is dissociated in a plasma, thus the energy of the plasma is substituted for a portion of the thermal energy employed by the prior art for the decomposition process. This process will be briefly described below. It is more fully described and claimed in copending application U.S. Ser. No. 266,545 and now U.S. Pat. No. 4,421,592 Dec. 20, 1983, titled, Plasma Assisted Deposits Of Semiconductor Films on Salt Substrates filed on even date herewith and sharing a common inventorship with the present case. In the process the reaction chamber is operated at a pressure of about 1 torr. A plasma zone is produced either through inductive coupling or capacitive coupling of RF energy to the precursor gas which is introduced into the plasma zone and flows through the plasma and over the substrate which is located within the plasma zone. Through this technique the substrate may be maintained at a temperature of about 450° C. rather than the 600° to 700° C. temperature required by the prior art processes which relied entirely upon the substrate thermal energy to decompose the precursor gas. At this lower temperature it is a surprising result that high deposition rates can be obtained. While reference has been made to the use of sodium chloride as a substrate, it is clear that the other alkali halide salts may be similarly employed and in fact mixtures of these salts may be employed to produce a crystal substrate having a precisely controlled lattice parameter.

The prior art has taken two approaches to substrate fabrication. Most commonly, the prior art has used a single crystal semiconductor substrate which is coated with a thin intermediate layer of a material such as sodium chloride and this intermediate layer forms the actual substrate surface upon which the desired semiconductor thin film is applied. This is described, for example, in U.S. Pat. Nos. 4,116,751 and 3,993,533. The second approach taken by the prior art is to use a bulk single crystal of sodium chloride as a substrate. This is shown for example in U.S. Pat. Nos. 3,158,511 and 3,186,880.

The difficulty with using sodium chloride as a substrate is that the sodium chloride has a substantially greater coefficient of thermal expansion than do the semiconductor materials of interest. Thus, even though deposition may be satisfactorily achieved at a temperature of 500° to 800° C., upon cooling to room temperature the sodium chloride substrate contracts substantially more than the deposited semiconductor film and this can lead to buckling or other physical damage to the semiconductor layer. This problem has not been to our knowledge successfully solved by the prior art.

The prior art has suggested removal of the sodium chloride substrate or sodium chloride interlayer material through the use of sublimation (U.S. Pat. No. 3,186,880), dissolution of the substrate as for example by water (U.S. Pat. No. 3,158,511), and in the case of the sodium chloride intermediate layer, it has been proposed to heat the substrate, intermediate layer and semiconductor layer to a temperature where the intermediate layer was molten and then to physically peel or slide off the semiconductor surface layer (U.S. Pat. No. 4,116,751). None of these removal approaches have been entirely successful. Thus it is the purpose of the present invention to particularly describe a method for the removal of semiconductor thin films from bulk alkali halide salt substrates. This removal process when used in combination with the deposition process described in co-pending application, Plasma Assisted Deposits Of Semiconductor Films On Salt Substrates, filed on even date herewith provides a complete fabrication technique for the low cost production of high quality single crystal semiconductor films.

DISCLOSURE OF INVENTION

The present invention is a method for removing an alkali halide salt substrate from a thin deposited epitaxial semiconductor layer without damage to the semiconductor. The salt (e.g. NaCl) substrate is placed in contact with a material (e.g. tungsten) that is wet by molten salt, and the substrate and wettable material are heated to a temperature slightly above the melting point of the salt (e.g. greater than 801° C.). When the salt melts it is drawn away from the semiconductor by capillary action of the wettable material.

Other features and advantages will be apparent from the specification and claims and from the accompanying drawings which illustrate an embodiment of the invention.

BEST MODE FOR CARRYING OUT THE INVENTION

This invention is a method for removing a salt substrate from a thin deposited semiconductor film. The invention method is performed soon after the deposition process. Because of the likelihood of damage to the semiconductor as a result of differential thermal contraction, the substrate semiconductor combination is not cooled after deposition but is maintained near the temperature at which the deposition was performed. The success of the invention is dependent upon the salt having a melting point which is less than the melting point of the semiconductor.

The substrate-semiconductor assembly is placed on a support assembly made of a material which is wettable by the salt (this wettable material must be more wettable than the semiconductor material). Although the material must be wettable by the salt, it should not undergo any substantial reaction with the molten salt. The salt substrate may be supported by the wettable support during the deposition of the semiconductor or the substrate-semiconductor may be transferred to the support assembly while still hot in the furnace after the deposition of the semiconductor. The substrate-semiconductor assembly on the wettable support (with substrate in contact with the support) is then heated to a temperature in excess of the melting point of the salt but not high enough to melt the semiconductor. When salt melts the molten salt is drawn away from the semiconductor by the wettable support. This deceptively simple procedure is effective in solving the problem, of substrate removal, which had not been solved by the concerted efforts of the prior art.

Figure 1:
FIG. 1 shows a cross section of the coated substrate.
Figure 2:
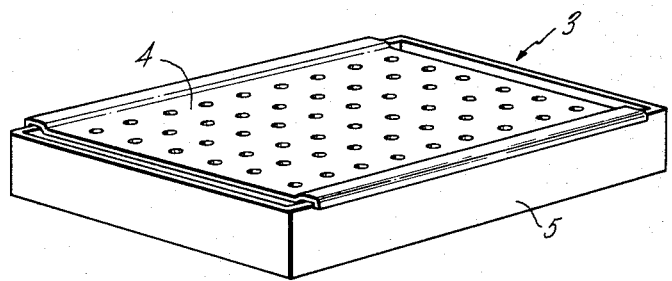
FIG. 2 shows a support assembly consisting of a perforated sheet.
Figure 3:
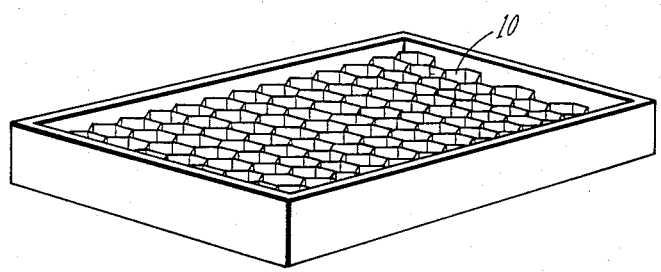
FIG. 3 shows a support assembly consisting of a honeycomb array.
Figure 4:
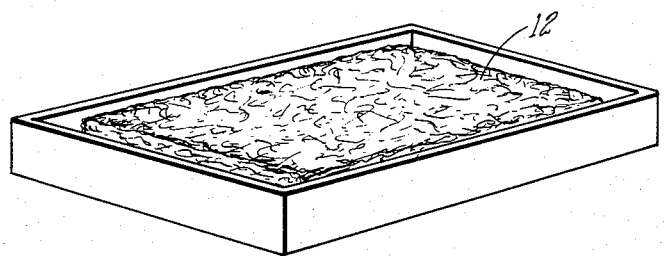
FIG. 4 shows a support assembly consisting of a mass of wettable fibers.

Numerous variations are possible for the wettable support. FIG. 1 shows the cross section of the substrate 1 an semiconductor film 2. FIG. 2 shows the geometry which has been proven effective in laboratory work. The support 3 is a perforated sheet 4 of a wettable material. In FIG. 2 the perforated sheet is supported on a frame 5. In use the substrate rests on the perforated sheet 4. In practice, tungsten has proven to be quite useful with sodium chloride substrates (whose melting point is 801° C.). Alternate geometries are shown in FIGS. 3 and 4. In FIG. 3 an open cell honeycomb structure 10 made of wettable material is employed and the substrate-semiconductor combination is supported by the honeycomb walls. Upon heating, the salt will melt and be drawn down into the honeycomb cells. FIG. 4 shows the use of a fibrous mass of wettable fibers such as tungsten wool which would be capable of effectively absorbing a large quantity of molten salt. As those skilled in the art will appreciate, the surface area of the wettable support must be great enough to absorb the mass of the melted substrate. Thus, the geometry of FIG. 2 is suitable for thin substrates while the geometry of FIG. 4 can be used with thicker substrates.

It should be understood that the invention is not limited to the particular embodiments shown and described herein, but that various changes and modifications may be made without departing from the spirit and scope of this novel concept as defined by the following claims.

We claim:

1. A method for removing a semiconductor from an alkali hailde substrate, the alkali halide having a melting point which is less than that of the semiconductor, which consists of:
   a. supporting the semiconductor-substrate combination on a support which is wettable by the substrate material, when molten, said support being adapted to attract and remove the substrate material from the semiconductor when the substrate is molten, with the substrate contacting the wettable support;
   b. heating the semiconductor-substrate-support combination to a temperature above the melting point of the substrate material but below the melting point of the semiconductor material so that the molten substrate material will be removed from the semiconductor material by capillary action.

2. A method as in claim 1 in which the support is made of tungsten.

3. A method as in claim 1 in which the substrate comprises sodium chloride.

4. A method as in claim 1 in which support is a perforated sheet.

5. A method as in claim 1 in which the support is an open cell honeycomb structure and the semiconductor-substrate combination is supported on the honeycomb walls.

6. A method as in claim 1 in which the support includes a mass of wettable fibers.

7. In the method of producing thin semiconductors by epitaxial deposition of semiconductor material on a alkali halide substrate at elevated temperature, the improvement which comprises: after deposition at elevated temperature, and without cooling the substrate significantly, contacting the substrate with a material which is wettable by the substrate material, when the substrate material is molten, and heating the semiconductor-substrate-wettable material combination to a temperature above the melting point of the substrate material, but below the melting point of the semiconductor material so that the molten substrate material will be removed from the semiconductor material by capillary action.

* * * * *